May 30, 1961 R. J. ANDRES ET AL 2,986,678

SEMICONDUCTOR DEVICE

Filed June 20, 1957 2 Sheets-Sheet 1

INVENTORS.
Raymond J. Andres,
BY Charles G. Thornton,
Mueller & Aichele
Att'ys.

INVENTORS.
Raymond J. Andres,
BY Charles G. Thornton,
Mueller & Aichele
Attys.

United States Patent Office 2,986,678
Patented May 30, 1961

2,986,678

SEMICONDUCTOR DEVICE

Raymond J. Andres, Scottsdale, and Charles G. Thornton, Phoenix, Ariz., assignors to Motorola, Inc., Chicago, Ill., a corporation of Illinois Filed June 20, 1957, Ser. No. 666,902
6 Claims. (Cl. 317—234)

The present invention relates to semiconductor devices having a novel configuration, to a method of assembling such semiconductor devices, and more particularly to silicon diodes and improved methods of assembling them.

Because of the diminutive size of semiconductor devices, development of methods for their assembly has been difficult. Such methods must be reasonably simple and are preferably adapted for use with automatic assembly techniques to take advantage of the economies associated with such techniques. In addition, the assembly method must provide for the consistent making of good electrical contacts and for the handling of very small parts without breaking or injuring them.

The use of silicon as a material for the manufacture of diodes or rectifiers is attractive since silicon has a number of advantages over such materials as selenium and copper oxide. For example, silicon may be used over a wide temperature range with very low leakage compared with other semiconductor material now in use. Also, silicon rectifiers can be made much smaller than conventional rectifiers. For example, a silicon diode can replace a selenium rectifier occupying 64 times as great a volume.

Various techniques are known for the formation of rectifying junctions in silicon such as diffusion with gaseous or solid diffusants. In addition to the preparation of a PN rectifying junction in the silicon itself, it is necessary to make reliable mechanical and electrical contacts to the P and to the N regions in order to have a satisfactory diode. In the past, it has been very difficult to make reliable contacts, especially ohmic contacts to silicon. Spring-biased pressure contacts have been used in a number of cases but such contacts are of questionable reliability on applications where units are subject to vibration and also introduce a very serious danger of cracking the silicon die during assembly or use. Other expedients that have been resorted to include embedding a flexible wire contact in a solder ball on a silicon surface. In this type of assembly, the critical jigging operation must be carried out very carefully in order to position accurately the lead in the solder ball and this presents substantial practical difficulties. Because of the difficulty of wetting the silicon surface with solder, the solder ball serves primarily as a weight attached to the end of the lead to hold it in contact with the silicon surface.

Diodes that rectify relatively high voltage current often generate a substantial amount of heat and provision must be made in their design for the dissipation of this heat.

It is an object of the present invention to provide a semiconductor device which may be assembled easily and which does not employ spring contacts which might fracture the semiconductor die.

It is another object of the invention to provide a simple and reliable method of assembling diminutive semiconductor devices that will produce a good electrical contact between the leads and the semiconductor surface.

It is still another object of the invention to provide a diminutive silicon diode having a relatively high breakdown voltage.

Another object of the invention is to provide a diode for use in rectification of high voltage current wherein the heat generated is dissipated efficiently to avoid injury to the diode.

A feature of the present invention is the provision of a semiconductor die unit with a metallic layer on both surfaces thereof and a pair of conductive leads secured to the metallic layer intervening between the leads and the die unit with the leads in good electrical contact with the semiconductor substance.

Another feature of the invention is the provision of a method for assembling a semiconductor device wherein the weight of one of the leads connected to the die unit rests upon it during a soldering operation to insure the maintenance of good contact therewith.

Another feature of the invention is the provision of a method for soldering together a number of specially prepared silicon diodes to produce a composite diode of desired electrical characteristics.

Another feature of the invention is the provision of a semiconductor device which is particularly small, compact and adapted for convenient insertion into an electronic chassis, particularly a printed circuit panel board.

Referring now to the accompanying drawings:

Fig. 1 is an exploded perspective view of a semiconductor device during its assembly showing the elements of a semiconductor die unit which is to be incorporated into the device;

Fig. 1*a* is a perspective view of a treated semiconductor wafer and a solder ribbon making up a semiconductor die unit containing only one die;

Fig. 1*b* is a view in section of a semiconductor die;

Fig. 1*c* shows a silicon die and solder ribbon assembly containing two silicon dice positioned between two leads just prior to soldering;

Figure 2:
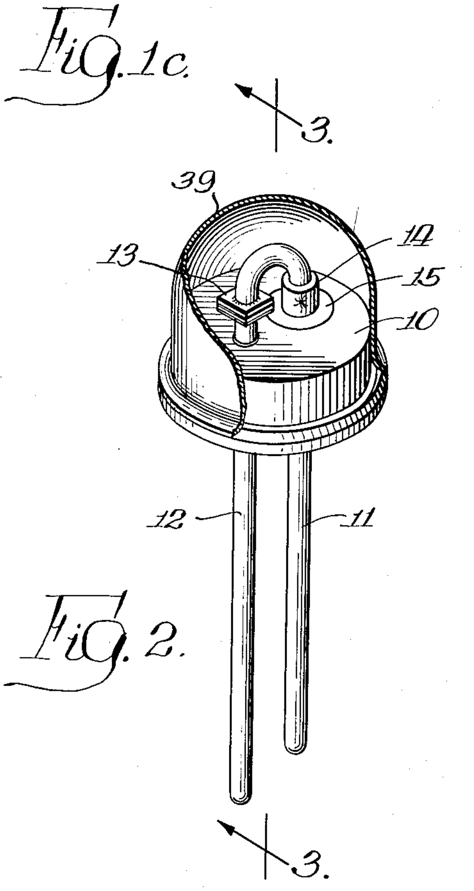
Fig. 2 is a view in perspective of a completed semiconductor device with its cover broken away to show the positioning of the semiconductor die unit and the leads.
Figure 7:
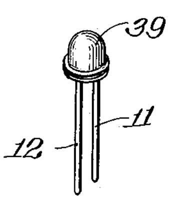
Figure 7A:
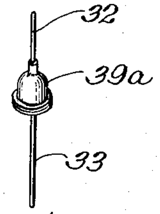
Figure 3:
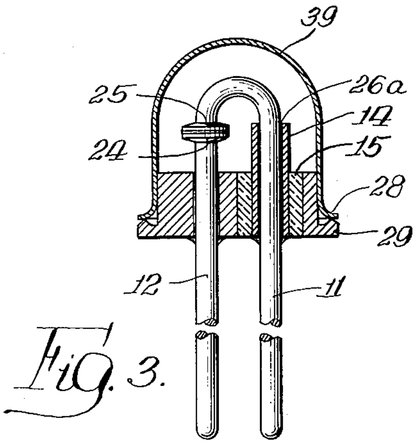
Fig. 3 is a view in section taken on line 3—3 of Fig. 2.
Figure 3A:
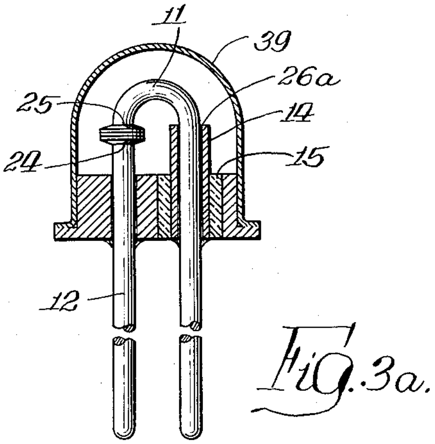
Figure 4:
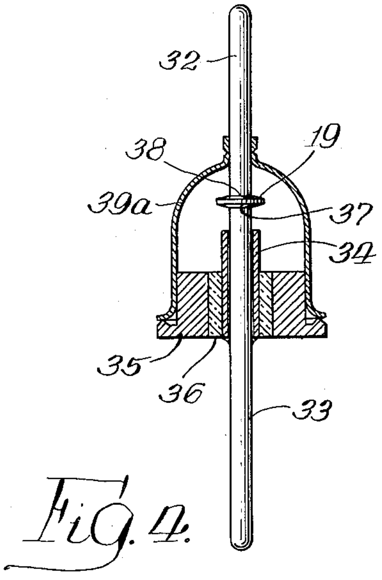
Figures 5, 6:
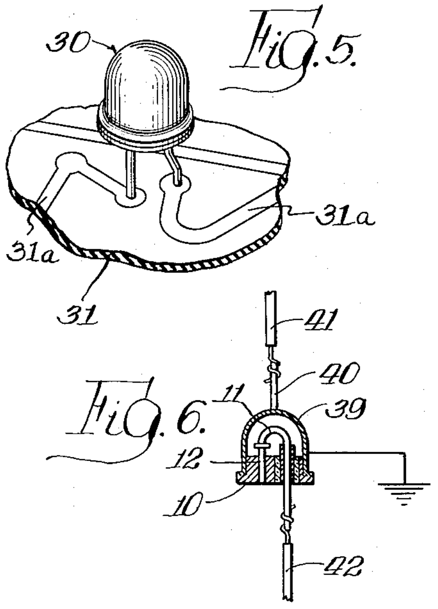

Fig. 3*a* is a view similar to Fig. 3 except showing the cover portion secured to the base portion;

Fig. 4 is a sectional view of a different embodiment of the invention wherein one lead extends through the base and the other through the top of the cover;

Fig. 5 is a perspective view showing a unit of the type illustrated in Fig. 2 affixed to a printed circuit board;

Fig. 6 is a sectional view of the embodiment of the invention illustrated in Figs. 3 and 3*a* showing how a lead may be attached at the top of the cover portion; and Figs. 7 and 7*a* are perspective views showing the actual size of two semiconductor devices embodying different aspects of the present invention.

In accordance with the present invention, a semiconductor device includes, in combination, a semiconductor die unit, metallic layers on each side of the die unit, a pair of conductive leads each with one end held in contact with the metallic layers on the opposite sides of the die unit and making electrical contact with the semiconductor material through the intervening metallic layers. At least one of the leads is rigidly secured to a base member and a cover member for the device is secured to the base member and cooperates with it to enclose the semiconductor die unit. In assembling the semiconductor device, at least one of the lead members is inserted through a base member and a semiconductor die unit is positioned between the ends of the base lead and the other lead with the weight of one of the leads resting against the corresponding surface of the semiconductor die unit. The ends of the leads are then secured to opposite surfaces of the semiconductor die unit as by soldering and subsequently a cover member is secured to the base member to enclose the assembly.

Figure 1A:
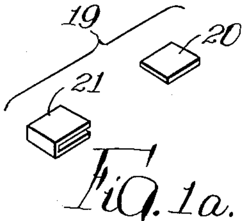
Figure 1B:
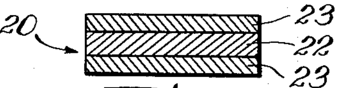
Figure 1:
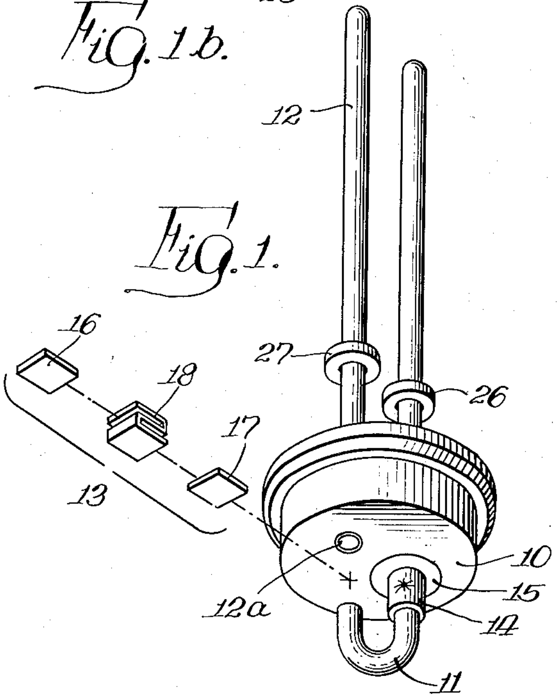

There is shown in Fig. 1 an exploded view of a semiconductor unit of the present invention in a stage of partial assembly. The disc-shaped pedestal or base 10 is provided with a pair of apertures to accommodate the hooked lead 11 and the straight lead 12. As shown in Fig. 2, the semiconductor die unit indicated generally at 13 is held between the ends of leads 11 and 12 and is in ohmic contact with them.

In order to prevent short circuiting between leads 11 and 12 through the base 10 which is normally made of a conductive material such as copper or steel, it is necessary to insulate one of the leads. The lead 11 is staked to a sleeve 14 of an alloy capable of being sealed to glass such as, for example, that manufactured under the trademark "Kovar" by the Westinghouse Electric Co. A glass compression ring or bushing 15 secured within the base 10 surrounds the alloy sleeve 14, holds it to the base and serves to insulate the lead 11 from the base 10.

In the form illustrated in Fig. 1, the semiconductor die unit 13 is made up of semiconductor dice 16 and 17 and solder ribbon 18. In assembling the semiconductor die unit the dice 16 and 17 are inserted inside the arms of the solder ribbon 18 so as to form a unit having alternate layers of semiconductor dice and solder.

In the embodiment shown in Fig. 1*a*, a form of semiconductor die unit 19 is shown in which only a single semi-conductor die 20 is inserted between the arms of solder ribbon 21. Any number of dice may be used to make up the assembly with a greater number being used for diodes of higher breakdown voltage. Breakdown voltage is increased by stacking the dice with the P side of one die facing the N side of the adjacent die.

As more particularly shown in Fig. 1*b*, the semiconductor die 20 (as well as the semiconductor dice 16 and 17) is made up of a semiconductor layer 22 of germanium or silicon, preferably the latter, and layers 23 of metal on either side thereof. The semiconductor layer 22 has been suitably treated to form a rectifying junction by methods forming no part of the present invention. The metal layer 23 is a conductive metal to which a lead can conveniently be soldered to form an ohmic contact and may be gold, silver, cobalt, rhodium or, in accordance with a specific embodiment of the present invention, nickel. According to one suitable method of making this die unit, a silicon die in which a rectifying PN junction has been formed is prepared for nickel coating by first dipping it in a solution of hydrofluoric acid and subsequently in a solution containing potassium hydroxide and hydrogen peroxide. This specially prepared silicon surface will receive a layer of nickel deposited by the reduction of nickelous chloride from solution by sodium hypophosphite.

In assembling the diode shown in Figs. 1–3*a*, the hooked lead 11 is staked to the alloy sleeve 14 which is held firmly within the base 10 by means of the glass compression ring 15. The straight lead 12 is inserted through the aperture **12*a* from the side of the base facing upward in Fig. 1. Thus, during assembly, the unit is held upside-down from its normal mounting position and the leads 11 and 12 point upward. The semiconductor die unit which may consist of one or more individual semiconductor dice is inserted between the end 24 of lead 12 and the end 25 of lead 11. The end portions of the leads should be as flat as possible and their surfaces should form a right angle with the sides of the leads. The weight of the straight lead 12 holds it against the top of the die assembly 13 and presses it against the supporting end 25 of the lead 11. Solder rings 26 and 27 around the leads 11 and 12, respectively, are moved down to base 10 and the assembly is ready for soldering. This is preferably accomplished by placing the entire assembly in a heated inert atmosphere at a temperature sufficient to melt the solder. During the soldering operation the lead 12 is only loosely held in aperture 12*a* and so is free to move downwardly against the die unit until the solder from the ring 27 has filled the space between lead 12 and the base 10 and hardened thus firmly fixing the lead to the base. Before the solder hardens, the weight of lead 12 presses the end 24 against the top of the semiconductor die assembly 13 which in turn urges the unit against the end 25 of lead 11. The lead 11, which is securely held in the base 10 by ring 15 and sleeve 14, thus serves as a fixed base. As the solder ribbon melts, close contact between the solder ribbon and the ends of the leads is still maintained because of the weight of lead 12 so that a very firm joint is secured when the solder hardens. Upon melting, solder ring 26 flows into the space between lead 11 and sleeve 14 and upon hardening serves to further secure them to one another. This solder connection is indicated by the reference character 26*a*** in Figs. 3 and 3*a*.

In accordance with one embodiment of the present invention, the solder ribbons 18 and 21 are made of a solder of very high lead content, for example, containing 95% lead and 5% tin. Solder of this composition is believed to dissolve the nickel layer and form a composition diffusing into the silicon crystal forming a good bond that has good chemical resistance during the subsequent etching step. However, other tin-lead solders containing less than 95% lead and even pure tin may be used. The solder may also contain small amounts of other metals such as gold, silver and copper.

Figure 1C:
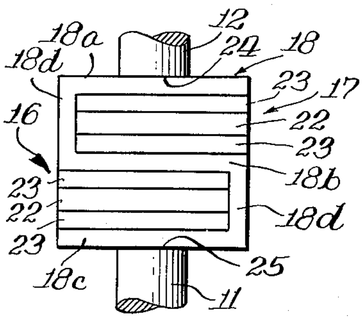

As more particularly shown in Fig. 1*c*, the semiconductor dice 16 and 17 consisting of semiconductor layer 22 and metal layers 23 are held between arms **18*a*, 18*b* and 18*c* of solder ribbon 18. When the solder ribbon 18 begins to melt, the solder in the edge portion 18*d* moves into the space between the semi-conductor die unit and the ends of the leads. This is because the solder preferentially wets the nickel surface 23 as compared to the silicon edges of the semiconductor layer 22**. Because of this selective wetting property of the solder, it is possible to employ solder ribbons in the form shown and still avoid short circuiting across the edges of the semiconductor die unit. Of course, solder discs inserted between the semiconductor dice and the ends of the leads may also be employed in practicing the invention.

After the soldering step has been completed the assembly is given a selective coating of wax with the exception of the leads and the semiconductor die assembly and is then dipped in an etching solution of conventional composition. One typical solution of this nature contains approximately equal volumes of acetic, nitric, and hydrofluoric acids together with a small amount of bromine. The etching step repairs mechanical damage that has been done during the handling of the dice and which might have impaired their semiconductor properties.

The assembly is rinsed in demineralized water after etching and is then impregnated with silicone varnish which protects the freshly etched surface.

The unit is now ready to be enclosed in the cover 39 which is a bell-shaped member made of conductive metal, such as mild steel. The cover 39 has a turned-out lip portion 28 which rests on the shoulder 29 of base 10 as shown in Fig. 3. The lip 28 is then pressed against the shoulder portion 29 as shown in Fig. 3*a* and is welded thereto as by capacitor discharge welding. The unit is now ready for use and it may be mounted in an upright position as shown in Fig. 5, where a finished unit 30 is shown mounted on a typical printed circuit chassis 31 and in electrical contact with the thin conductive circuit pattern **31*a***.

In some instances, it may be desirable to fill the space inside the envelope with an inert gas such as argon. This is sometimes done in preparing diodes for rectifying high voltage current. The welding enclosure may be filled with the inert gas or cover 39 may be provided with a pinch-off tube, the space back filled with gas and the tube sealed off in accordance with known techniques after welding the cover and filling with gas.

Another embodiment of the invention is shown in Fig. 4. The semiconductor die assembly 19 is held between the ends of leads 32 and 33, which extend from opposite ends of the unit. This permits "in-line" mounting of the device. Assembly of the embodiment illustrated in Fig. 4 is very similar to assembly of the embodiments previously described. The lead 33 is inserted through and staked to the alloy sleeve 34 which is held in the conductive base 35 by means of glass compression ring 36. As in the embodiments previously described, the alloy sleeve 34 may be "Kovar" which is sealed to the glass ring. The semiconductor die assembly is placed on the flat end 37 of the lead 33 and held against it by flat end 38 of lead 32. The weight of the lead 32, which may be augmented by additional pressure, maintains good contact between the ends of the leads and the assembly 19 during the soldering operation which is carried out in the same manner as previously described. While the soldering of the leads to the semiconductor unit is taking place, a solder ring threaded around lead 33 is also used to further secure lead 33 to the sleeve 34.

After the etching and oil impregnation treatment the cover member 39*a* provided with a suitable hole is threaded over lead 32, secured thereto as by a solder joint and then welded to the base 35. In Fig. 4, cover 39*a* is shown in position prior to welding.

Fig. 6 illustrates still another embodiment of the present invention showing how a device of the type illustrated in Fig. 2 may be adapted for "in-line" mounting. Here the straight lead 12 has been clipped off flush with the base 10 and a lead 40 has been soldered to the conductive cover 39 at the top thereof. This permits the device to be secured between two leads such as 41 and 42 as shown in Fig. 6. As shown in this embodiment, one side of the diode is grounded through cover 39. The device may, of course, also be grounded through the leads.

Use of the present invention in connection with silicon diodes permits the manufacture of very small, rugged units of the types shown in Figs. 7 and 7*a*. These figures show the actual size of commercial diode units and illustrate the significant size reduction obtainable in accordance with the present invention as well as giving an idea of the practical difficulties attending the assembly of such small units. The individual silicon dice used are typically about 0.008 inch thick and about 0.065 inch along each edge. In some instances, it may be desirable to form the dice into circular, rectangular or other shapes, the only requirement being that the area be sufficient to carry the rated electrical current.

In each of the embodiments of the invention shown, the base member serves as a heat dissipating member and is in heat exchange relation with the semiconductor die unit. This is particularly important when the semiconductor device is a power rectifier or diode operating at a high voltage such as above 400 volts and generating a very substantial amount of heat. In such an embodiment the base member is preferably made of copper because of its superior heat transfer characteristics. In a silicon diode operative up to 1500 volts in which a copper base member of 0.385 inch outside diameter was used and in which the distance from the bottom of the base to the top of the cover is 0.376 inch, a temperature difference of only 6° C. per watt of heat generated between the rectifying junction and the base is observed.

The present invention embodies a construction of a semiconductor device that is particularly adapted for silicon diodes or rectifiers but which may be also used in the assembly of other semiconductor devices. Thus, the semiconductor die employed may be either silicon or germanium. One advantage of the construction of the present invention is the provision of an intervening metallic layer between a semiconductor die and the lead to which it is soldered and with which it makes ohmic contact. By arranging the leads and the semiconductor die unit with the weight of one lead pressing the unit against the other lead, provision is made for good contact between the leads and the unit during the subsequent soldering operation since the melting of solder allows the leads to maintain close contact with the semiconductor die unit surface. The invention also provides for an improved method of assembling of semiconductor devices whereby the leads may be secured to the semiconductor die units after having been positioned by a simple gigging operation and whereby the unit may be easily enclosed in a container providing a hermetic seal.

What is claimed is:

1. A diode, including in combination, a silicon die unit having two opposite sides and containing a PN rectifying junction therein, a metallic layer on each of said sides, a conductive lead having a hooked end positioned adjacent one of said metallic layers, a body of solder positioned between said one metallic layer and said hooked end of said lead, with said lead and said solder and said one metallic layer establishing ohmic contact with one side of said die unit, base means of conductive material with said hooked lead rigidly supported therein, said base means in heat exchange relation with said silicon die unit, a cover member for said diode secured to said base and cooperating therewith to enclose said silicon die unit, and a straight conductive lead rigidly supported by said base and ohmically connected to the other side of said silicon die unit through the other of said metallic layers.

2. A diode according to claim 1 wherein said silicon die unit includes a plurality of individual metal coated silicon dice.

3. A diode including in combination a semiconductor unit having two opposite sides, a base of conductive material, said semiconductor unit being positioned adjacent said base with one of said sides facing toward said base and the other of said sides facing away therefrom, conductive means having a first portion extending from one side of said base through and to the other side of the base and insulatingly supported therein, a second portion extending vertically from the first portion and in a substantially U-shape and terminating in an end secured to the side of the semiconductor unit facing away from said base, the side of said semiconductor unit facing toward said base being in electrical and thermal conductive relationship with said base and spaced away from said first portion of said conductive means, and cover means secured to said base and covering the substantially U-shape portion of the conductive means and said semiconductor unit.

4. In a diode having a semiconductor unit therein including two opposite sides conductive and mounting means for said diode including in combination a metal base having two opposite sides with the semiconductor unit positioned with one side thereof facing toward one side of said base and with the other side of said unit facing away from said base, a pair of conductive portions extending from the other side of said base with one of said conductive portions extending through but insulated from the metal of the base and the other in conducting relation therewith, a substantially hook-shaped conductive portion at said one side of said base and extending longitudinally from said one conductive portion to the side of the semiconductor unit facing away from said base, and metal means including solder connecting said hook-shaped conductive portion to the side of said semiconductor unit facing away from said base and connecting the other side of said semiconductor unit in conductive relation with said mounting base at a point spaced laterally from the point where said first conductive portion extends through the base.

5. A semiconductor diode including in combination, a metal mounting base, a semiconductor die having a PN junction therein, first and second metal coatings on the exterior of said semiconductor die located on opposite sides of said junction, said die being positioned at one side of said base with said first metal coating facing toward said base and said second metal coating facing away from said base, and said base being in heat exchange relation with said die, first and second metal leads projecting from the other side of said base, with said first lead being connected to said base and said second lead extending through said base and projecting from said one side thereof, said second lead having a substantially hook-shaped portion extending longitudinally from said one side of said base to said second metal coating on said die, means insulating said second lead from said base, a first body of solder connecting said hook-shaped portion of said second lead to said second metal coating for making ohmic contact with said die on one side of said junction, and a second body of solder connected to said first metal coating for making ohmic and heat transferring contact with said die on the other side of said junction.

6. In a diode including a semiconductor unit of diode type which has two opposite sides, a mounting and connector assembly for said semiconductor unit including in combination, an electrically and thermally conductive base having two opposite sides with the semiconductor unit positioned so that one side thereof faces toward one side of said base and the other side thereof faces away from said base, electrically and thermally conductive connector means insulated from the conductive material of said base and supported by said base, said connector means including a substantially U-shaped portion terminating at an end secured to the side of the semiconductor unit which faces away from said base, said connector means having a further portion electrically common with said U-shaped portion and available on the other side of said base for making an electrical connection externally of said diode, hollow means forming a generally tubular receptacle which receives a portion of said connector means in telescoping relation therewith for positioning said U-shaped portion with said end thereof and said semiconductor unit in pressing relation with each other during assembly of said diode, means ohmically and thermally connecting said end of said U-shaped portion to the side of said semiconductor unit facing away from said base, and means establishing the side of said semiconductor unit facing toward said base in heat transferring relation with said base and in ohmic electrical connection with said base.

References Cited in the file of this patent

UNITED STATES PATENTS

| | | |
|---|---|---|
| 1,454,997 | Greco et al. | May 15, 1923 |
| 1,537,124 | Lytton | May 12, 1925 |
| 1,702,836 | Mann | Feb. 19, 1929 |
| 2,685,728 | Ohl | Aug. 10, 1954 |
| 2,699,594 | Bowne | Jan. 18, 1955 |
| 2,751,527 | Shower | June 19, 1956 |
| 2,817,046 | Weiss | Dec. 17, 1957 |
| 2,853,661 | Houle et al. | Sept. 23, 1958 |